United States Patent
Lee (10) Patent No.: US 11,959,695 B2
(45) Date of Patent: Apr. 16, 2024

(54) LIQUID COOLING SYSTEM WITH WATER QUALITY MONITORING

(71) Applicant: ASIA VITAL COMPONENTS CO., LTD., New Taipei (TW)

(72) Inventor: Sung-Wei Lee, New Taipei (TW)

(73) Assignee: FOSITEK CORPORATION, New Taipei (TW)

( * ) Notice: Subject to any disclaimer, the term of this patent is extended or adjusted under 35 U.S.C. 154(b) by 276 days.

(21) Appl. No.: 16/666,416

(22) Filed: Oct. 29, 2019

(65) Prior Publication Data
US 2021/0123669 A1  Apr. 29, 2021

(51) Int. Cl.
F25D 29/00 (2006.01)
F25D 17/02 (2006.01)
F28F 3/00 (2006.01)

(52) U.S. Cl.
CPC .......... *F25D 29/005* (2013.01); *F25D 17/02* (2013.01); *F25D 29/008* (2013.01); *C02F 2209/06* (2013.01); *F25B 2700/19* (2013.01); *F28F 3/00* (2013.01)

(58) Field of Classification Search
CPC .................................................. C02F 2209/06
See application file for complete search history.

(56) References Cited

U.S. PATENT DOCUMENTS

| | | | | |
|---|---|---|---|---|
| 2007/0017811 A1* | 1/2007 | Waskaas | ................ | F28F 13/16 204/196.01 |
| 2007/0102367 A1* | 5/2007 | Owens | ...................... | C02F 1/66 210/724 |
| 2015/0235545 A1* | 8/2015 | Schoenheit | ............. | C02F 1/008 210/85 |
| 2015/0284276 A1* | 10/2015 | Ongeche | ............... | C02F 1/4602 210/663 |

(Continued)

FOREIGN PATENT DOCUMENTS

| CN | 2904589 Y | 5/2007 |
|---|---|---|
| CN | 104460544 A | 3/2015 |

(Continued)

OTHER PUBLICATIONS

Search Report dated Feb. 10, 2020 issued by Taiwan Intellectual Property Office for counterpart application No. 108133631.

(Continued)

*Primary Examiner* — Peter Keyworth
(74) *Attorney, Agent, or Firm* — Demian K. Jackson; Jackson IPG PLLC (57) ABSTRACT

The present invention relates to a liquid cooling system with water quality monitoring, which comprises a first inlet, a first outlet, a heat exchange unit, a sensing unit, and a control unit connected to the sensing unit and a first pump. The heat exchange unit has a heat exchanger connected to the first inlet and the first pump connected to the first outlet and the heat exchanger. The first pump is used to drive a first working liquid after heat exchange in the heat exchanger.

(Continued)

The sensing unit senses a pH value of a first working liquid to generate a sense signal. The control unit compares the sense signal with a preset pH range to generate a compared result which is sent to an external interface. By means of the design of the present invention, the pH value of water can be monitored.

12 Claims, 6 Drawing Sheets

(56) References Cited

U.S. PATENT DOCUMENTS

2019/0145722 A1* 5/2019 Myers .................. F28F 27/00
165/303

FOREIGN PATENT DOCUMENTS

| | | |
|---|---|---|
| CN | 107959404 A | 4/2018 |
| CN | 109548361 A | 3/2019 |
| CN | 109561633 A | 4/2019 |
| TW | M547644 U | 8/2017 |
| TW | M589423 U | 1/2020 |

OTHER PUBLICATIONS

Search Report dated May 6, 2020 issued by China National Intellectual Property Administration for counterpart application No. 2019108806659.

* cited by examiner

LIQUID COOLING SYSTEM WITH WATER QUALITY MONITORING

BACKGROUND OF THE INVENTION

Field of the Invention

The present invention relates to a liquid cooling system and, in particular, to a liquid cooling system with water quality monitoring which can monitor the pH value of water.

Description of Prior Art

With the development of technology, the convenience of human life is improved especially in the fields of various data processing and internet applications, which requires the operation of electronic equipment. Thus, the electronics equipment having the ability of high-speed process and huge memory storage is commonly used in various companies.

A traditionally available cabinet (or rack) used in the fields of IT, communication, industry, traffic, and transportation and capable of containing various heat generating devices is taken as an example. The interior of the cabinet (or rack) is a closed receiving space for containing a plurality of heat generating devices (for example, CPUs, microprocessors, microchips, single chips, or other units or apparatuses generating heat driven by electrical power). In addition, there are plural water-cooled heat sinks attached to various heat generating devices in the receiving space in which a working liquid is delivered to the radiator through a pipe set and a pump. Besides, the air in the receiving space of the cabinet (or rack) is driven by a fan installed therein such that heat exchange takes place between the working liquid absorbing the heat in the radiator and the air in the cabinet (or rack). In this way, the objectives of dissipating heat and cooling down various heat generating devices can be achieved.

However, the above-mentioned heat dissipation cycle occurs only inside the cabinet (or rack). When several high-power CPUs are disposed in the cabinet (or rack), the air discharged from the cabinet (or rack) through the radiator and the fan installed therein keeps at relatively high temperature. Further, because the cabinet (or rack) is a closed space, the hotter air tends to remain inside and cannot be discharged. As a result, the whole heat dissipation efficiency continues to deteriorate and the heat cannot be removed immediately, which causes extremely poor heat dissipation and inefficient heat exchange.

In view of this, the inventor pays special attention to research with the application of related theory and tries to improve and overcome the above disadvantages regarding the above-related art, which becomes an improvement target of the inventor and the people in the related fields.

SUMMARY OF THE INVENTION

One objective of the present invention is to provide a liquid cooling system with water quality monitoring which can monitor the pH value of water.

Another objective of the present invention is to provide a liquid cooling system with water quality monitoring which can achieve the flow control of the working liquid, the automatic refill function, and the system pressure control.

Yet another objective of the present invention is to provide a liquid cooling system with water quality monitoring which provides an alert reminder.

To achieve the above objectives, the present invention provides a liquid cooling system with water quality monitoring, which comprises a first inlet, a heat exchange unit, a sending unit, and a control unit. The heat exchange unit has a heat exchanger connected to the first inlet and a first pump connected to the first outlet and the heat exchanger; the first pump is used to drive a first working liquid after heat exchange in the heat exchanger. The sensing unit is provided with at least one pH sensor through which the first working liquid flows; the pH sensor is used to sense a pH value of the first working liquid and generate a sense signal corresponding to the pH value. The control unit is connected to the sensing unit and the first pump; the control unit compares the sense signal with a preset pH range to generate a compared result that is sent to an external interface. By means of the design of the liquid cooling system with water quality monitoring of the present invention, the monitoring of the pH value of water and the effect of the alert reminder can be achieved effectively. In addition, the flow control of the working liquid, the automatic refill function, and the system pressure control also can be achieved effectively.

DETAILED DESCRIPTION OF THE INVENTION

The above objectives, structural and functional characteristics of the present invention will be described according to the preferred embodiments with the accompanying figures.

The present invention provides a liquid cooling system with water quality monitoring. Please refer to FIG. 1 which is a block diagram of the liquid cooling system according to the first embodiment of the present invention, FIG. 2 which is a block diagram of the liquid cooling system according to an embodiment derived from the first embodiment of the present invention, FIG. 3 which is a block diagram of the liquid cooling system for implementation according to the first embodiment of the present invention, FIG. 3A which is a block diagram of the liquid cooling system for implementation according to an embodiment derived from the first embodiment of the present invention. As shown in FIGS. 1-3A, the liquid cooling system 1 is applied in a data center (e.g., a server room or a house) in which at least one cabinet 60 to carry information technology equipment such as the server or network communication equipment is disposed inside the data center such as a server room. By means of the liquid cooling system 1 of the present invention disposed inside the server room, the flow supply of the first working liquid 51 (e.g., the coolant) can be controlled; the smart monitoring of the pH value, the water flow, and the system pressure can be performed; the control of the water flow, water temperature, and automatic refill can be performed. When implemented, the present invention has other functions of smart monitoring and reminding; for example, the smart monitoring of the leaking points and the water temperatures at the outlet, or the smart setting and alert reminder. The liquid cooling system 1 comprises a first inlet 11, a first outlet 12, a second inlet 13, a second outlet 14, a heat exchange unit 10, a sensing unit 15, and a control unit 16. The heat exchange unit 10 is connected to the first inlet 11 and the first outlet 12 through a plurality of first pipes 191; the heat exchange unit 10 is connected to the second inlet 13 and the second outlet 14 through a plurality of second pipes 192. In the current embodiment, the first inlet 11 and the first outlet 12 are connected to the rack inlet 601 and the rack outlet 602 of the rack 60, respectively, through the first pipes 191. The second inlet 13 and the second outlet 14 are connected to an external water supply 40 (e.g., a chiller or a cooling tower) which provides a second working liquid 52 (e.g., a coolant) through a plurality of first pipes 191. For example, the water inlet 401 and the water outlet 402 of the external water supply 40 (e.g., a chiller) are connected to the second inlet 13 and the second outlet 14, respectively, through the second pipes 192. The temperature of the second working liquid 52 entering the second inlet 13 is lower than that of the first working liquid 51 discharging from the first outlet 12. The temperature of the second working liquid 52 entering the second inlet 13 is also lower than that of the first working liquid 51 at the first inlet 11 and that of the second working liquid 52 at the second outlet 14.

The heat exchange unit 10 has a heat exchanger 101 connected to the first inlet 11, a first pump 102 connected to the first outlet 12, and a liquid tank 104 containing the first working liquid 51. The liquid tank 104 is disposed between the heat exchanger 101 and the first pump 102; the liquid tank 104 is connected to the heat exchanger 101 and the first pump 102. In the current embodiment, the liquid tank 104 is connected to the heat exchanger 101 and the first pump 102 through a plurality of first pipes 191. The liquid tank 104 is used as a buffer for temporary storage of the first working liquid 51 passing through the heat exchanger 101. In the current embodiment, the heat exchanger 101 is a plate heat exchanger, but not limited to this. The heat exchanger 101 provides a place for heat exchange between the high-temperature working liquid (e.g., the high-temperature first working liquid 51 to the first inlet 11) and the low-temperature working liquid (e.g., the low-temperature second working liquid 52 at the second inlet 13). The first inlet 11 collects the high-temperature first working liquid 51 which has flowed through the electronic devices such as CPUs of the information technology equipment in at least one rack 60. The second inlet 13 is used to allow the low-temperature second working liquid 52 without waste heat from the outside (e.g., the external water supply 40) to enter the heat exchanger 101 in the liquid cooling system 1. The first outlet 12 is used to provide the high-temperature first working liquid 51 which has flowed through the heat exchanger 101, the liquid tank 104, and the first pump 102 in sequence and then is cooled down to become the low-temperature first working liquid 51 which is discharged out of the liquid cooling system 1. The second outlet 14 is used to discharge the second working fluid 52 at high temperature with waste heat after the second working fluid 51 at low temperature passes through the heat exchanger 101. The first outlet 12 and the first inlet 11 are connected to one side of the first pump 102 and one side of the heat exchanger 101, respectively, through a plurality of first pipes 191. The second outlet 14 and the second inlet 13 are individually connected to one side (or the other side) of the heat exchanger 101 through a plurality of second pipes 192.

Therefore, the path from the first inlet 11 to the first outlet 12 is an inner circulation path of the liquid cooling system 1; the path from the second inlet 13 to the second outlet 14 is an outer circulation path of the liquid cooling system 1. The first working liquid 51 in the inner circulation path and the second working liquid 52 in the outer circulation path are each circulated in their respective loops and do not mix. Through the heat exchanger 101, the heat exchange between the high-temperature working liquid (e.g., the high-temperature first working liquid 51 at the first inlet 11) and the low-temperature working liquid (e.g., the low-temperature second working liquid 52 at the second inlet 13) occurs. Thus, the heat is delivered from the high-temperature first working liquid 51 to the low-temperature second working liquid 52. After the first working liquid 51 is cooled down, it flows into and is stored the liquid tank 104. Then, the low-temperature first working liquid 51 in the liquid tank 104 is discharged by the first pump 102 toward the first outlet 12 and into the rack 60 for the continuous water cooling cycle. At the same time, the low-temperature second working liquid 52 absorbs the heat and becomes the high-temperature second working liquid 52 which is then discharged to the external water supply 40 through the second outlet 14. After the first working liquid 51 is cooled down, its temperature decreases.

The first pump 102 is used to drive the low-temperature first working liquid 51 which has undergone heat exchange in the heat exchanger 101 and stored in the liquid tank 104 to flow through the first outlet 12 into the rack 60. The sensing unit 15 is provided with at least one pH sensor 151 and at least one temperature sensor 153, both of which are disposed at the positions the first working liquid 51 flows through. In the current embodiment, the pH sensor 151 is disposed in the liquid tank 104 to sense a pH value of the first working liquid 51 and generate a sense signal which is corresponding to the pH value and sent to the control unit 16. The temperature sensor 153 is disposed on the first pipe 191 close to the first outlet 12 to sense the temperature of the low-temperature first working liquid 51 discharged from the first outlet 12 and generate a temperature signal which is sent to the control unit 16. When implemented, the pH sensors 151 and the temperature sensors 153 are not limited in number, as described above. The user can design according to the accuracy of the pH value of water and the requirements of temperatures inside the system in advance to arrange more than two pH sensors 151 and more than two temperature sensors 153 at the positions the first working liquid 51 flows through. For example, two pH sensors 151 can be individually disposed in the liquid tank 104 and in any of the plural first pipes 191 (e.g., the first pipe 191 close to the liquid tank 104 to sense the pH values of the working liquid in the liquid tank 104 and the first working liquid 51 in the first pipe 191 to generate the corresponding sense signals which is sent to the control unit 16. Two temperature sensors 153 are individually disposed on the first pipe 191 close to the first outlet 12 and on the second pipe 192 close to the second outlet 14 to sense the temperatures of the low-temperature first working liquid 51 and the high-temperature second working liquid 52, respectively.

Figure 1:
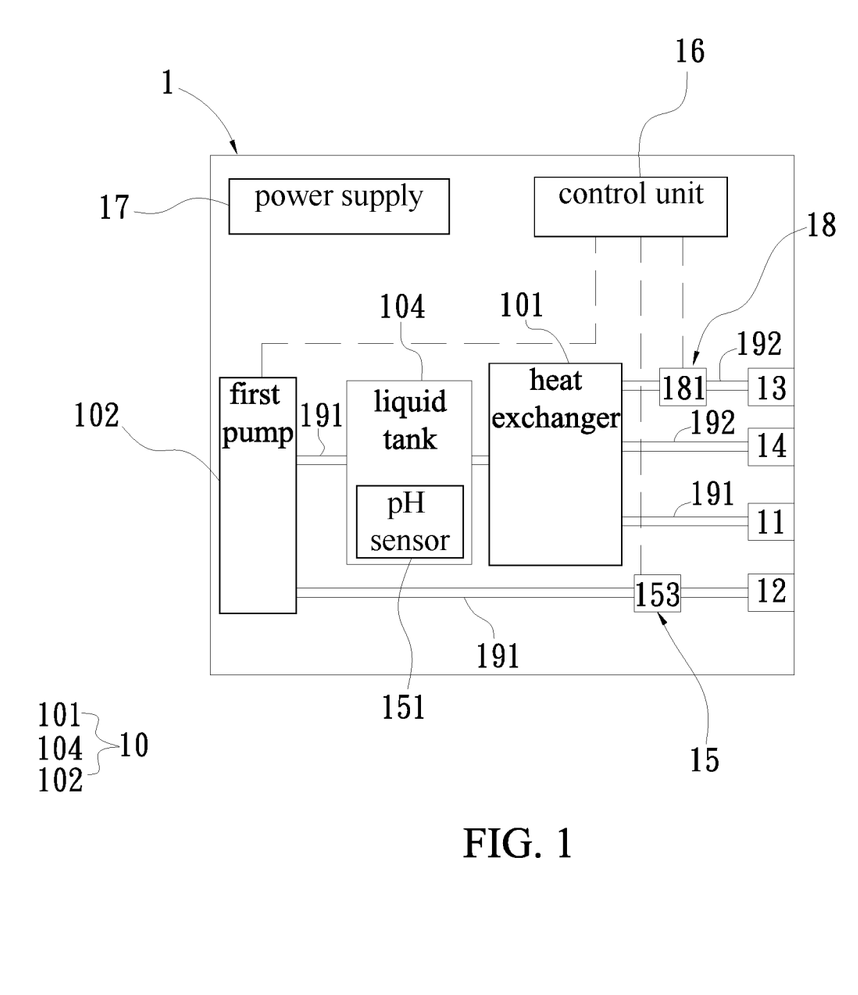
FIG. 1 is a block diagram of the liquid cooling system according to the first embodiment of the present invention.
Figure 2:
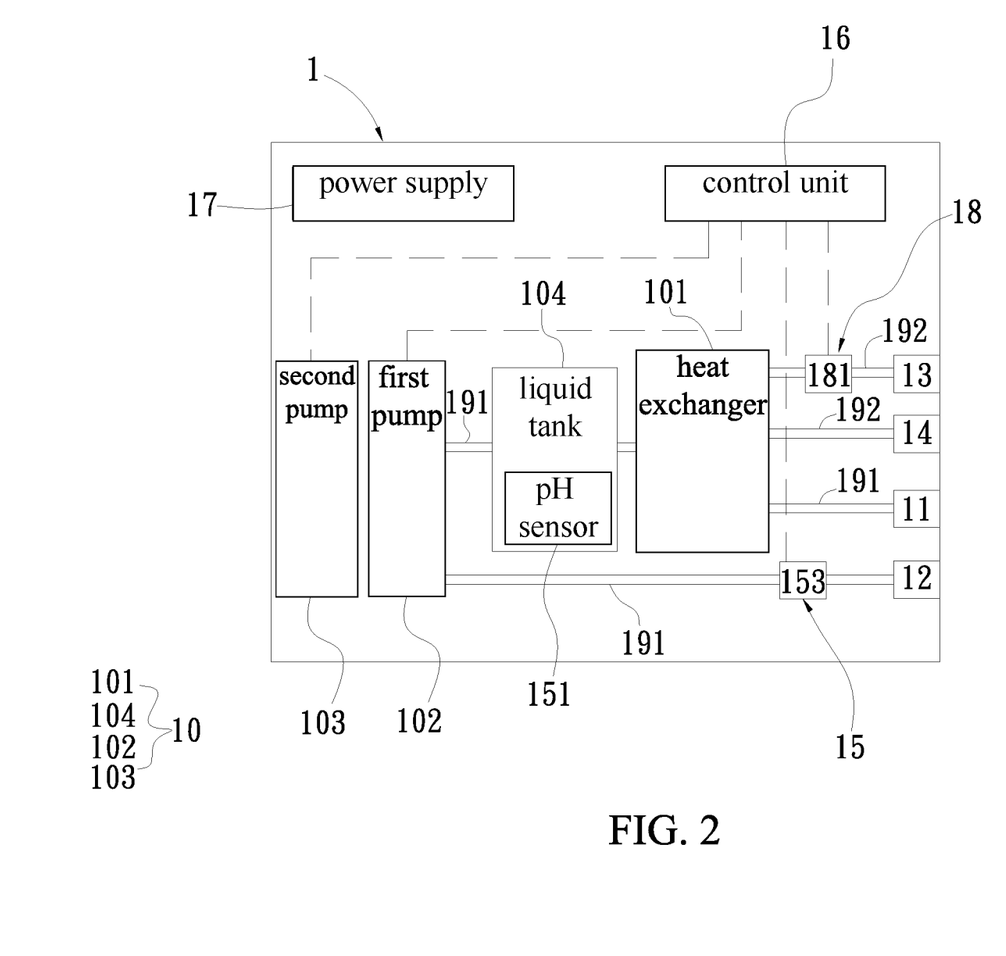
FIG. 2 is a block diagram of the liquid cooling system according to an embodiment derived from the first embodiment of the present invention.

In an embodiment, referring to FIG. 2, the heat exchange unit 10 is further provided with a second pump 103; the second pump 103 and the first pump 102 are connected in parallel or in serial; one can be served as a backup for the other. When one of these two pumps fails, the other will continue to drive the first working liquid 51 such that the backup function of pumps and continuous driving for the first working liquid 51 can be achieved.

In another embodiment, a filter (not shown) can be disposed in the liquid tank 104. The filter is used to filter and isolate the impurities or foreign particles in the first working liquid 51 which has been cooled down by the heat exchanger 101 to trap the impurities or foreign particles in the liquid tank 104 such that the first pump 102 drives the filtered first working liquid 51 through the filter in the liquid tank 104 to be discharged through the first outlet 12 to the rack 60. In this way, the purity of the working liquid can be maintained and the heat transfer efficiency can be improved.

Figure 3:
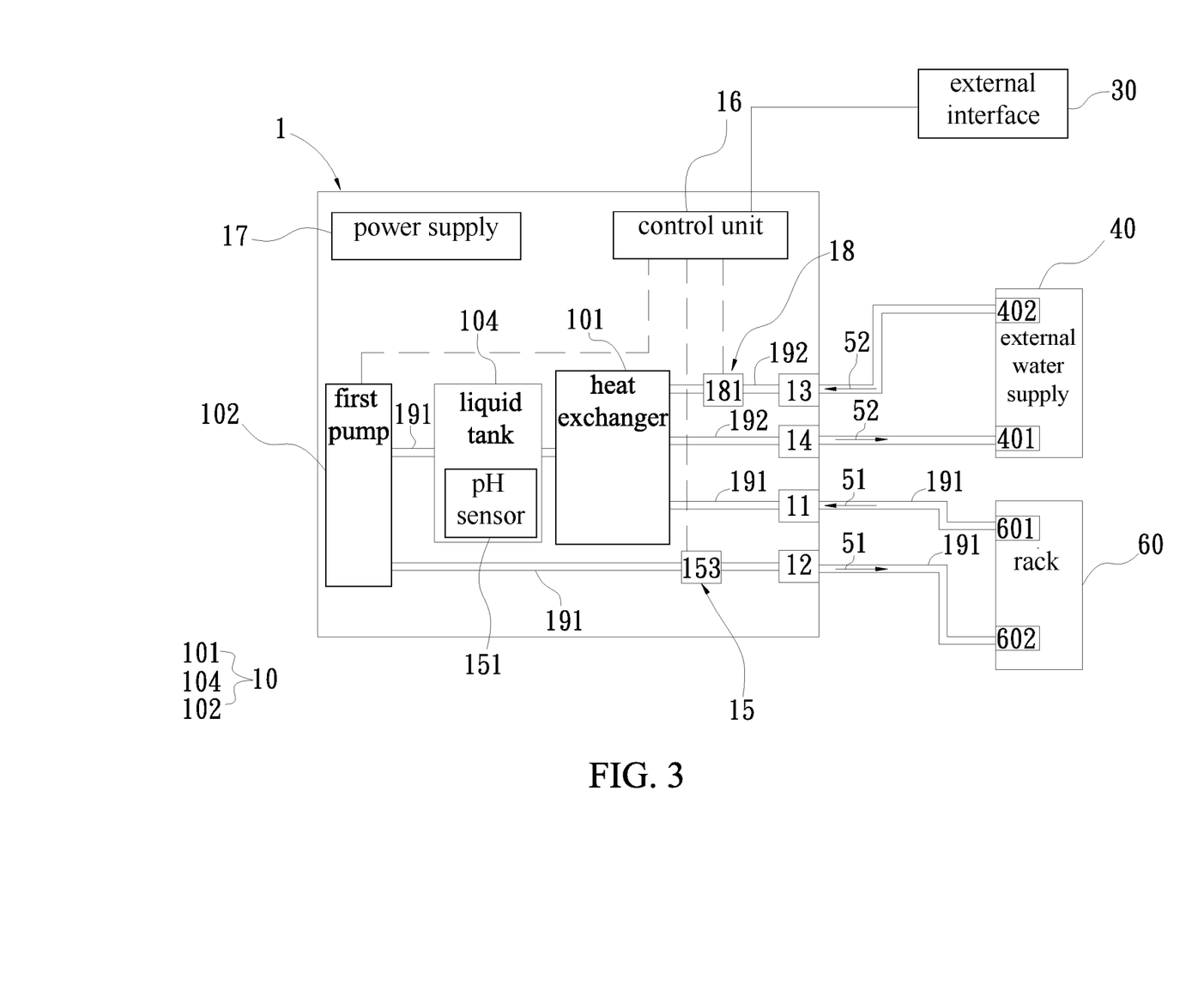
FIG. 3 is a block diagram of the liquid cooling system for implementation according to the first embodiment of the present invention.
Figure 3A:
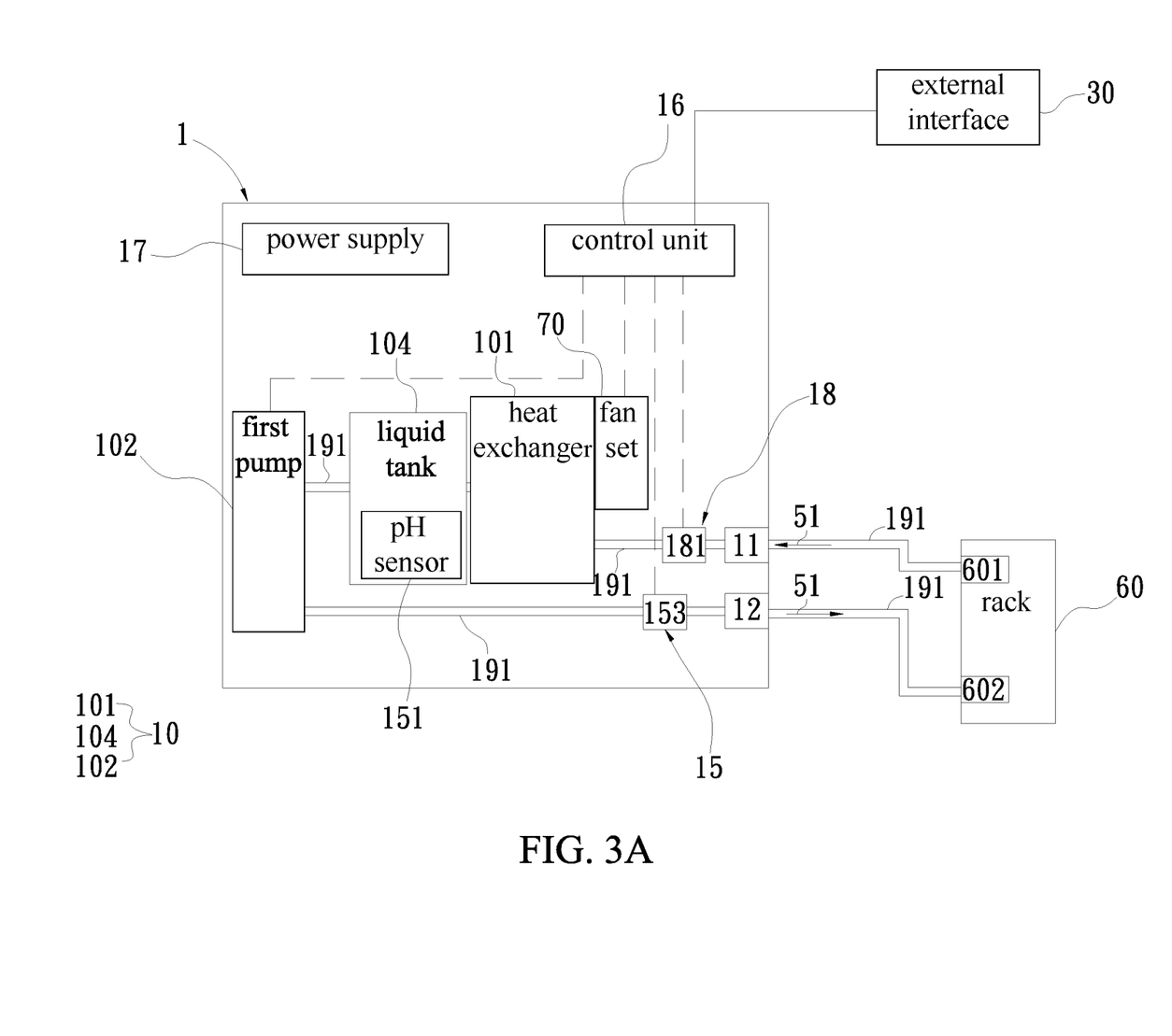
FIG. 3A is a block diagram of the liquid cooling system for implementation according to an embodiment derived from the first embodiment of the present invention.

Referring to FIG. 3, the control unit 16 is connected to the sensing unit 15 and the first pump 102. In the current embodiment, the control unit 16 is a programmable logic controller (PLC), but not limited to this. When implemented, the control unit 16 can be a digital signal controller (DSC), a digital signal processor (DSP), or a microprocessor (MCU). The control unit 16 compares the sense signal with a preset pH range to generate a compared result that is sent to an external interface 30. In the current embodiment, the external interface 30 is a monitoring system. The external interface 30 that is connected to the control unit 16 through wireless transmission or wired transmission is used to receive the compared result sent from the control unit 16. The pH range can be set from PH1 to PH14. For instance, a preferable pH range is from PH5 to PH6.5. In an embodiment, the external interface 30 can be a display, a light-emitting device, a smart mobile apparatus, or a speaker. By means of the external interface 30 which displays the information, emits reminder sound (or alert sound), or emits a reminder light (or alert light), the user can realize the real-time operation of the liquid cooling system 1.

When the control unit 16 compares a pH value (e.g., PH7) of the sense signal with a first preset pH value (e.g., PH6.5) within the preset pH range, if the pH value (e.g., PH7) of the sense signal is greater than the first preset pH value (e.g., PH6.5), the control unit 16 generates a compared result of a safety state. Then, the external interface 30 shows the compared result sent from the control unit 16 through a monitor (not shown) such that the user can realize that the current pH value of water in the liquid cooling system 1 is in the safety state by means of the compared result shown on the monitor. Thus, the effect of real-time water monitoring is achieved.

When the control unit 16 compares a pH value of the sense signal with a first preset pH value (e.g., PH6.5) and a second pH value (e.g., PH6.0) within the preset pH range, if the pH value (e.g., PH6.3) of the sense signal is lower than the first preset pH value (e.g., PH6.5) and greater than the second pH value (e.g., PH6.0), the control unit 16 generates a compared result of a first alert state (e.g., a yellow alert state). Then, the external interface 30 shows the compared result sent from the control unit 16 through a monitor such that the user can realize that the current pH value of water in the liquid cooling system 1 is in the first alert state by means of the compared result shown on the monitor. When the control unit 16 compares a pH value (e.g., PH5.5) of the sense signal with the second preset pH value (e.g., PH6.0) and a third pH value (e.g., PH5.0) within the preset pH range, if the pH value (e.g., PH5.5) of the sense signal is lower than the second preset pH value (e.g., PH6.0) and greater than the third pH value (e.g., PH5.0), the control unit 16 generates a compared result of a second alert state (e.g., a red alert state). Then, the external interface 30 shows the compared result sent from the control unit 16 through a monitor such that the user can realize that the current pH value of water in the liquid cooling system 1 is in the second alert state by means of the compared result shown on the monitor.

When the control unit 16 compares a pH value (e.g., PH4.9) of the sense signal with the third preset pH value (e.g., PH5.0) within the preset pH range, if the pH value (e.g., PH4.9) of the sense signal is lower than the third preset pH value (e.g., PH5.0), the control unit 16 generates a compared result of an idle state. Then, the external interface 30 shows the compared result sent from the control unit 16 through a monitor. Meanwhile, the external interface 30 sends a stop signal to the control unit 16 of the liquid cooling system 1 to stop the operation of the first pump 102 such that the user can realize that the current pH value of water in the liquid cooling system 1 is in the idle state by means of the compared result shown on the monitor.

In an embodiment, the rack 60 and the external water supply 40 (e.g., a chiller) are capable of being connected to two liquid cooling systems 1, one of which serves as a backup. When the currently operating liquid cooling system 1 stops the operation after receiving the stop signal from the external interface 30, the external interface 30 will send an actuation signal simultaneously to start another liquid cooling system 1. In this way, the water cooling cycle for the information technology equipment in the rack 60 can continue. In another embodiment, the external interface 30 can send an operating status message (e.g., the compared result) of the liquid cooling system 1 corresponding to a specific server room by means of an text message, email, app message, or communication software to a smart mobile apparatus (e.g. a smart phone or a tablet) held by a remote user. Thus, the user can realize that the operating status of the liquid cooling system 1 in the rack 60 of each server room.

The present invention performs liquid-to-liquid heat exchange through the liquid cooling system 1, monitors the operating status (including the pH value of water) of the liquid cooling system 1 automatically, sends the reminder or alert messages automatically, and thus can be called a smart liquid-to-liquid coolant distribution unit (LTLCDU). In an embodiment, referring to FIG. 3A, the second inlet 13, the second outlet 14, the second working liquid 52, the second pipes 192, and the external water supply 40 (e.g., the chiller) are omitted compared with the embodiment in FIG. 3. In the current embodiment of FIG. 3A, a fan set 70 having a plurality of fans is connected to a side of the heat exchanger 101 corresponding to the first inlet 11 (or to the other side of the heat exchanger 101); the fan set 70 is connected to the control unit 16. Besides, the heat exchange between the high-temperature first working liquid 51 from the first inlet 11 and the cold wind discharged forcedly from the fan set 70 takes place through the heat exchanger 101. Thus, the heat of the high-temperature first working liquid 51 is removed and the first working liquid 51 is cooled down and at low temperature to be stored in liquid tank 104. Then, the low-temperature first working liquid 51 in the liquid tank 104 is discharged by means of the first pump 102 toward the first outlet 12 and into the rack 60 for the continuous water cooling cycle. The present invention also performs liquid-to-air heat exchange through the liquid cooling system 1, monitors the operating status of the liquid cooling system 1 automatically, sends the reminder or alert messages automatically, and thus can be called a smart liquid-to-air coolant distribution unit (LTACDU).

Moreover, the liquid cooling system 1 further comprises a power supply 17 and a flow control unit 18. The power supply 17 is electrically connected to and provides power to the control unit 16, the sensing unit 15, the flow control unit 18, and the first pump 102. The control unit 16 is electrically connected to the flow control unit 18 which is disposed at a proper place in the liquid cooling system 1 and controls the flow of the first working liquid 51 flowing in the first pipes 191. The flow control unit 18 is provided with at least one water valve 181. In the current embodiment, the water valve 181 is disposed on the second pipe 192 close to the second inlet 13, but not limited to this. The disposed position of the water valve 181 is not limited in the present invention. In other embodiments, the water valve 181 can be disposed on the first pipe 191 close to the first inlet 11 (or the first outlet 12). Therefore, the user can send a control signal promptly to the control unit 16 according to the temperature signal which is sent from the control unit 16 and received by the external interface 30, and is shown as a sensed temperature reading on the monitor. The control unit 16 controls the water valve 181 to control the flow through the second inlet 13 according to the control signal.

Therefore, by mean of the design of the liquid cooling system of the present invention, the pH value monitoring of water and the alert reminder can be effectively achieved. Further, the flow control of the working liquid, the automatic refill function, and the system pressure control can be effectively achieved.

Figure 4:
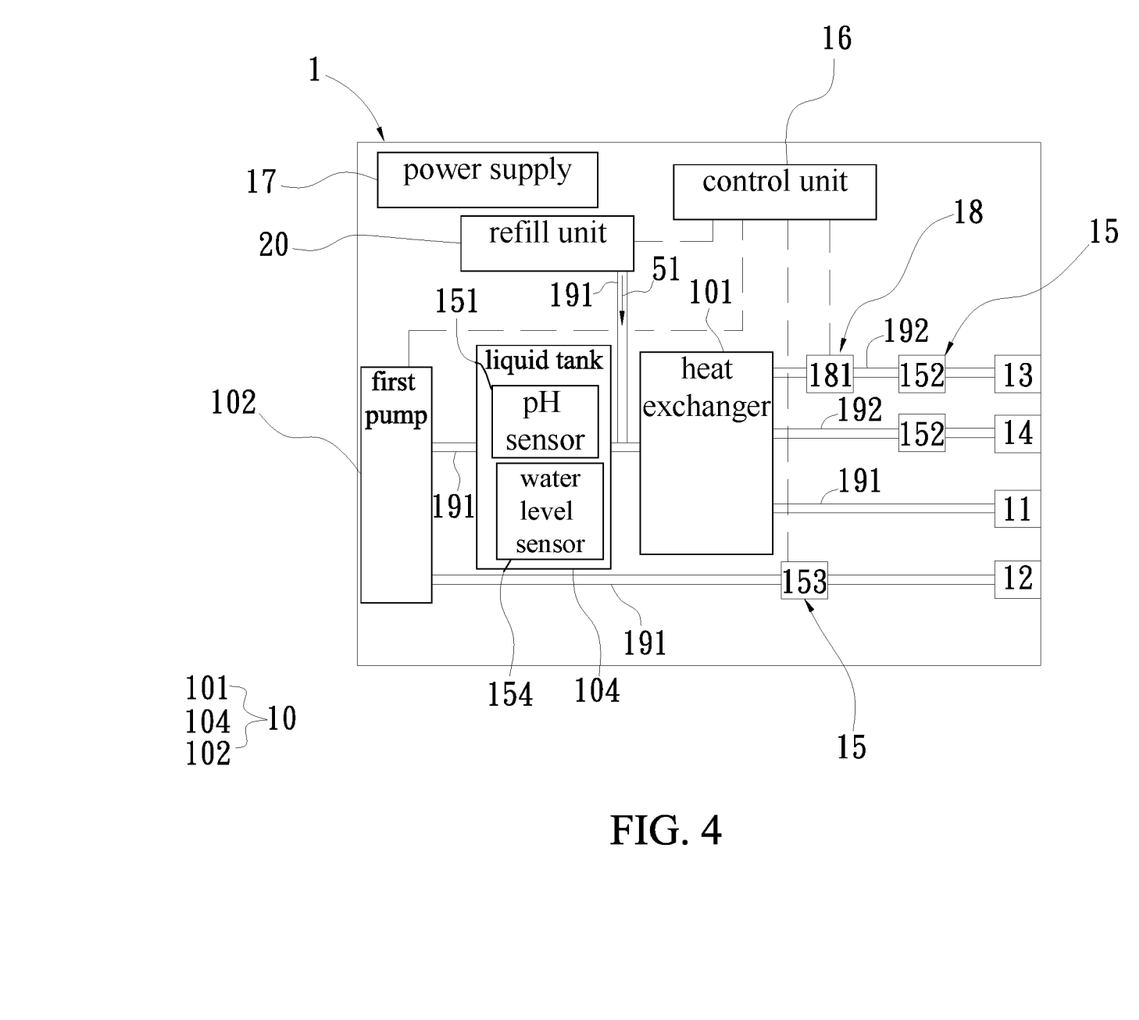
FIG. 4 is a block diagram of the liquid cooling system according to the second embodiment of the present invention.
Figure 5:
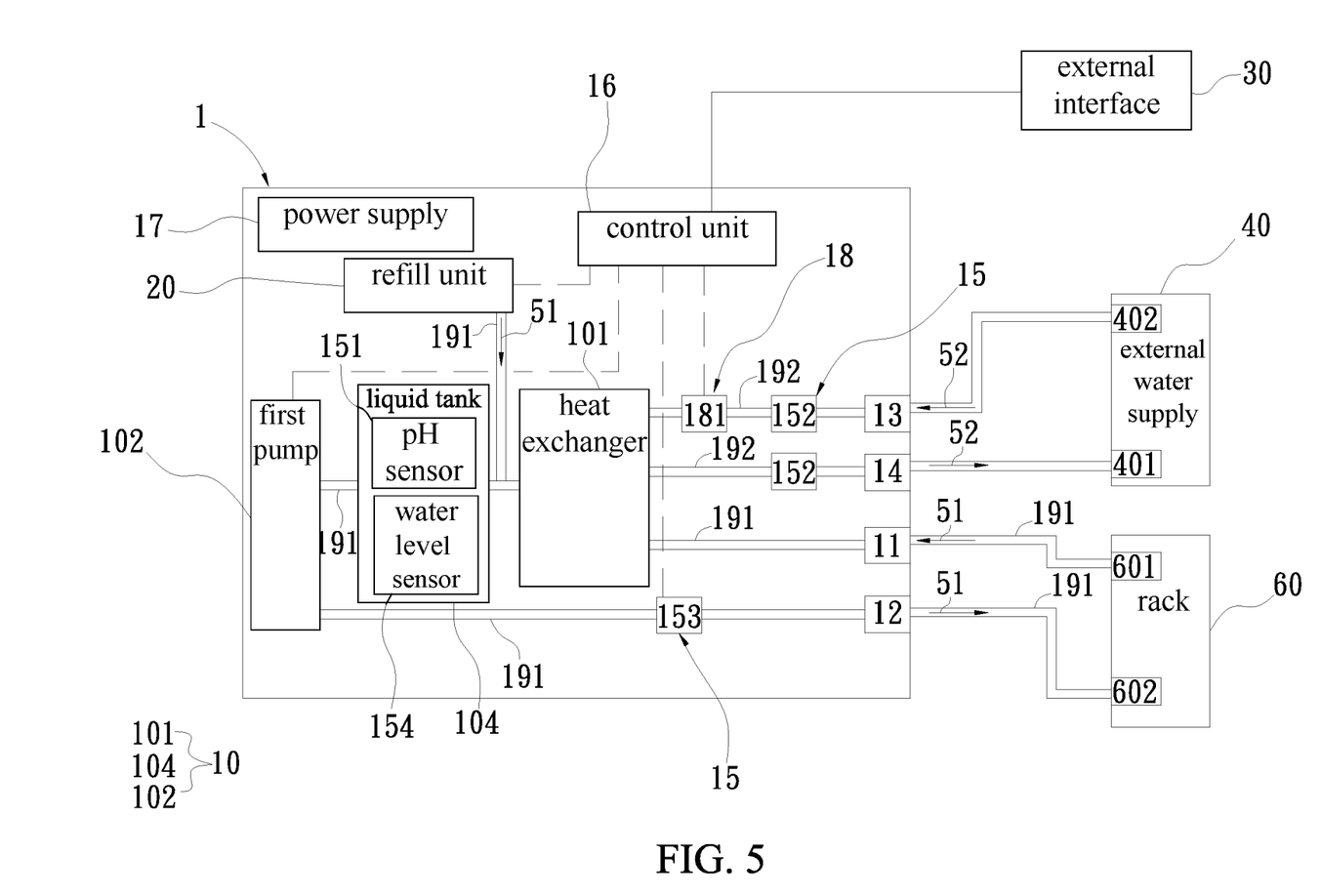
FIG. 5 is a block diagram of the liquid cooling system for implementation according to the second embodiment of the present invention.

Please refer to FIG. 4, which is a block diagram of the liquid cooling system according to the second embodiment of the present invention, and FIG. 5, which is a block diagram of the liquid cooling system for implementation according to the second embodiment of the present invention. The structure, connection relationship, and effects of the current embodiment are similar to those of the first embodiment and will not be described again. The difference between the first and second embodiments is that, in the second embodiment, the sensing unit 15 is provided with at least one pressure sensor 152 which is disposed at the positions through which the working liquid (e.g., the first and second working liquids 51, 52) flow to sense the pressure in the pipes 193 in the liquid cooling system 1. For example, the pressure sensor 152 is used to sense the pressure of at least one of the first inlet 11 (or the second inlet 13), the first outlet 12 (or the second outlet 14), and the first pipes 191 (or the second pipes 192) to obtain a pressure signal. In the current embodiment, there are two pressure sensors 152 which are disposed on the second pipe 192 close to the second inlet 13 and on the second pipe 192 close to the second outlet 14, respectively, such that the pressures of the low-temperature second working liquid 52 flowing from the second inlet 13 and the high-temperature second working liquid 52 flowing out of the second inlet 14 can be sensed and then sent to the control unit 16. Then, the control unit 16 will receive the above-mentioned pressure readings which is sent to be shown on the external interface 30 (e.g., the monitoring system). In this way, the user can adjust or control the operation of the liquid cooling system 1.

Furthermore, the liquid cooling system 1 further comprises a refill unit 20 which is electrically connected to the control unit 16. The refill unit 20 is connected to one of the first pipes 191 to supply the coolant (i.e., the first working liquid 51). When the at least one water level sensor 154 disposed in the liquid tank 104 senses that the water level in the liquid tank 104 is lower than the preset water volume, the water level sensor 154 will send a water level signal to the control unit 16 which then opens a water valve (not shown) in the refill unit 20 such that the refill unit 20 supplies water (e.g., the coolant) until the water level sensor 154 senses that the water level in the liquid tank 104 reaches the preset water volume. At this moment, the control unit 16 controls and closes the water valve in the refill unit 20 to stop the refilling process, which achieves the automatic refill function. In an embodiment, the refill unit 20 can be disposed at a proper position in the liquid cooling system 1 to supply the first working liquid 51 promptly to the liquid cooling system 1. For example, the refill unit 20 is disposed adjacent to the liquid tank 104 and connected to the liquid tank 104 through the pipe (not shown), which enables the direct water supply to the liquid tank 104.

What is claimed is:

1. A liquid cooling system with water quality monitoring comprising:
    a first inlet providing a first working liquid;
    a first outlet;
    a second inlet providing a second working liquid;
    a second outlet;
    a heat exchange unit having:
        a heat exchanger connected to the first inlet, the first outlet, the second inlet, and the second outlet such that the first inlet and outlet are fluidly isolated from the second inlet and outlet and such that the first and second working fluids both facilitate heat exchange in the heat exchanger, but do not mix with each other;
        a first pump connected to the first outlet and the heat exchanger, wherein the first pump drives the first working liquid after heat exchange in the heat exchanger;
        a liquid tank containing the first working liquid and disposed between and connected to the heat exchanger and to the first pump through a plurality of first pipes; and
        a second pump connected in parallel or in series with the first pump and configured to, in combination with the first pump, continuously drive the first working liquid;
    a sensing unit provided with at least one pH sensor disposed in the liquid tank through which the first working liquid flows, wherein the pH sensor senses a pH value of the first working liquid and generates a sense signal corresponding to the pH value of the first working fluid and at least one temperature sensor arranged on the first pipe and generating a temperature signal corresponding to a temperature of the first working fluid discharged through the first outlet; and
    a control unit connected to the sensing unit, the first pump, and the second pump, wherein the control unit compares the sense signal with a preset pH range to generate a compared result that is sent to an external interface and wherein the external interface sends a stop signal to the control unit which stops operation of the first pump when the compared result is an idle state.

2. The liquid cooling system with water quality monitoring according to claim 1, further comprising a power supply which is electrically connected to and provides power to the control unit, the sensing unit, and the first pump.

3. The liquid cooling system with water quality monitoring according to claim 1, further comprising a flow control unit and a refill unit, wherein the control unit is connected to the flow control unit and the refill unit, wherein the flow control unit is used to control the flow of the first working liquid in the first pipes, wherein the refill unit is connected to one of the first pipes to supply the first working liquid.

4. The liquid cooling system with water quality monitoring according to claim 1, wherein the sensing unit is provided with at least one pressure sensor used to sense at least one of the first inlet, the first outlet, and first pipes to obtain a pressure signal.

5. The liquid cooling system with water quality monitoring according to claim 1, wherein the pH value of the sense signal is greater than a first preset pH value within the preset pH range and the compared result is a safety state, wherein the pH value of the sense signal is lower than the first pH value and greater than a second preset pH value within the preset pH range and the compared result is a first alert state.

6. The liquid cooling system with water quality monitoring according to claim 5, wherein the pH value of the sense signal is lower than the second preset pH value and greater than a third preset pH value within the preset pH range and the compared result is a second alert state, wherein the pH value of the sense signal is lower than the third pH value and the compared result is the idle state.

7. The liquid cooling system with water quality monitoring according to claim 1, wherein the external interface is a monitoring system, a display, a light-emitting device, a smart mobile apparatus, or a speaker.

8. The liquid cooling system with water quality monitoring according to claim 1, wherein the external interface is connected to the control unit through wireless transmission or wired transmission.

9. The liquid cooling system with water quality monitoring according to claim 1, wherein the control unit is a programmable logic controller, a digital signal controller, a digital signal processor, or a microprocessor.

10. The liquid cooling system with water quality monitoring according to claim 1, wherein the heat exchanger is a plate heat exchanger.

11. The liquid cooling system with water quality monitoring according to claim 1, wherein the heat exchanger is connected to the second outlet and the second inlet through a plurality of second pipes, wherein the second outlet and the second inlet are connected to an external water supply through the second pipes, wherein the external water supply provides the second working liquid.

12. The liquid cooling system with water quality monitoring according to claim 1, wherein a fan set is connected to a side of the heat exchanger corresponding to the first inlet, wherein the fan set is connected to the control unit.

* * * * *

UNITED STATES PATENT AND TRADEMARK OFFICE
CERTIFICATE OF CORRECTION

| | | |
|---|---|---|
| PATENT NO. | : 11,959,695 B2 | Page 1 of 1 |
| APPLICATION NO. | : 16/666416 | |
| DATED | : April 16, 2024 | |
| INVENTOR(S) | : Sung-Wei Lee | |

It is certified that error appears in the above-identified patent and that said Letters Patent is hereby corrected as shown below:

On the Title Page

Item (73) Column 1 should read:
--ASIA VITAL COMPONENTS CO., LTD.--

Signed and Sealed this
Seventeenth Day of September, 2024

Katherine Kelly Vidal
*Director of the United States Patent and Trademark Office*